United States Patent [19]

Purdes

[11] Patent Number: 4,830,984

[45] Date of Patent: May 16, 1989

[54] METHOD FOR HEROEPITAXIAL GROWTH USING TENSIONING LAYER ON REAR SUBSTRATE SURFACE

[75] Inventor: Andrew J. Purdes, Garland, Tex.

[73] Assignee: Texas Instruments Incorporated, Dallas, Tex.

[21] Appl. No.: 220,917

[22] Filed: Jul. 18, 1988

Related U.S. Application Data

[63] Continuation of Ser. No. 87,058, Aug. 19, 1987, abandoned.

[51] Int. Cl.[4] .................... H01L 21/20; H01L 29/26; H01L 7/36
[52] U.S. Cl. .................... 437/126; 148/DIG. 56; 148/149; 148/DIG. 72; 148/DIG. 97; 148/33.3; 156/612; 156/610; 437/132; 437/247; 437/245; 437/939; 437/976
[58] Field of Search .................... 148/DIG. 59, 72, 97, 149, 33.2, 33.4, 33.5; 437/939, 976, 921, 132, 126, 86, 297, 173, 12, 81, 236, 245; 357/16, 60; 156/611-615

[56] References Cited

U.S. PATENT DOCUMENTS

| | | | |
|---|---|---|---|
| 3,458,369 | 12/1966 | Marinace | 437/976 |
| 3,808,674 | 5/1974 | Francombe et al. | 437/976 |
| 3,821,033 | 6/1974 | Hu | 437/976 |
| 3,821,039 | 6/1974 | Ettenberg | 437/12 |
| 3,836,999 | 9/1974 | Nishizawa | 357/63 |
| 3,914,136 | 10/1975 | Kressel | 437/976 |
| 3,962,716 | 6/1976 | Pétroff et al. | 357/16 |
| 3,997,368 | 12/1976 | Pétroff et al. | 437/12 |
| 4,079,506 | 3/1978 | Suzuki et al. | 148/33.3 |
| 4,131,487 | 12/1978 | Pearce et al. | 437/12 |
| 4,159,214 | 6/1979 | Mason | 156/612 |
| 4,415,373 | 11/1983 | Pressley | 437/12 |
| 4,548,658 | 10/1985 | Cook | 437/976 |
| 4,631,804 | 12/1986 | Roy | 437/976 |

OTHER PUBLICATIONS

Wolf et al., Silicon Processing for the VLSI Era, Lattice Press, Sunset Beach, California, Sep. 1987, pp. 191-193, 394-395.

*Primary Examiner*—Brian E. Hearn
*Assistant Examiner*—William Bunch
*Attorney, Agent, or Firm*—Ferdinand M. Romano; Carlton H. Hoel; Melvin Sharp

[57] ABSTRACT

A method, and products formed by such method, of providing a substantially planar surface to a layer of semiconducting material (24) formed on a first surface of a substrate (20), the substrate having a second surface opposite the first surface. The method comprising forming a layer (22) of a first material on the second surface of the substrate; forming a layer of the semiconducting material (24) on the first surface of the substrate; whereby said layer of said first material exerts a tensioning force on said second surface of the substrate (20) which countereffects a tensioning force exerted on said first surface of said substrate by said layer of semiconductor material (24) so that said first surface of said substrate has a substantially planar form. In some embodiments tensioning forces arise due to differential thermal expansion of said first material and said substrate and said semiconductor material and said substrate.

33 Claims, 1 Drawing Sheet

METHOD FOR HEROEPITAXIAL GROWTH USING TENSIONING LAYER ON REAR SUBSTRATE SURFACE

This application is a continuation of application Ser. No. 07/087,058 filed 08/19/87 now abandond.

TECHNICAL FIELD

This invention relates to methods and products for the manufacture of semiconductor devices, and more particularly to methods and products for improved formation of essentially epitaxial layers of a material on a substrate.

BACKGROUND OF THE INVENTION

In the design and manufacture of semiconductor devices, it has been proposed to fabricate semiconductor devices in gallium arsenide substrates. The use of gallium arsenide provides certain advantages over the more commonly used silicon substrates. For some applications, however, it has been proposed to fabricate semiconductor devices in a thin gallium arsenide layer which has been epitaxially deposited onto a silicon substrate.

A layer of gallium arsenide is typically formed on a silicon substrate by growth of the gallium arsenide layer on the silicon at temperatures of about 650° C. Warpage problems, however, frequently arise with gallium arsenide layers formed by these processes. It has been suggested that these warpage problems arise from the fact that the thermal expansion coefficient of gallium arsenide is approximate twice that of silicon. Accordingly, when the combination of the newly grown gallium arsenide layer on the silicon substrate is cooled to ambient conditions, the gallium arsenide layer contracts significantly more than the silicon substrate material. This increased contraction by one layer of the composite causes the composite to warp, with the surface of the gallium arsenide layer forming a concave surface. This concave surface is disadvantageous for further semiconductor fabrication processes on the gallium arsenide layer, particularly masking and patterning operations.

It is desirable to form a gallium arsenide layer on a silicon substrate in such a manner as to reduce or eliminate the warpage of the gallium arsenide layer upon cooling of the structure to room temperature conditions.

SUMMARY OF THE INVENTION

The present invention provides methods for, and products formed by, an improved process for forming a gallium arsenide layer on a silicon substrate. Prior to formation of the gallium arsenide layer on a first surface of the silicon substrate, a layer of a tensioning material is formed on a second surface of the silicon substrate. The second surface of the silicon substrate is on a side opposite that of the first surface of the silicon substrate. The combination of silicon substrate and tensioning material layer is treated to cause the tensioning material to contract. The contraction of the tensioning material causes the silicon substrate to warp forming a concave surface on the second surface (on which the tensioning materials formed), and forming a convex surface at the first surface of the substrate. The gallium arsenide layer is then formed on the first, convex, surface of the silicon, typically at elevated temperatures of approximately 650° C. As the device is cooled to room temperature, the gallium arsenide layer contracts to a greater degree or at a higher rate that the silicon substrate, providing a tensioning force on the first surface of the silicon substrate. The tensioning force of the gallium arsenide on the first surface of the silicon substrate counteracts and balances that of the tensioning material on the second surface of the silicon substrate and results in the silicon substrate and, consequently, the gallium arsenide layer having planar or approximately planar surfaces.

Proposed tensioning materials comprise metal silicides, particularly titanium silicide and tungsten silicide. The metal silicide can be formed on the second surface of the silicon substrate by numerous methods known in the art. After formation of the layer of tensioning material on the second surface of the silicon substrate, the layer of tensioning material is annealed at approximately 1000° C. Regardless of the process for formation of the layer of tensioning material, during annealing the tensioning layer achieves a standard state so that the resultant warpage upon cooling of the structure is reproducible or uniform. Accordingly, a reproducible or uniform tensioning effect is achieved regardless of the method used to form the tensioning layer on the silicon substrate.

The present invention advantageously provides a gallium arsenide layer on a silicon substrate with the gallium arsenide layer having a planar or approximately planar surface.

The present invention advantageously reduces or eliminates warpage arising from formation of the gallium arsenide layer on the silicon substrate.

BRIEF DESCRIPTION OF THE DRAWINGS

For a more complete understanding of the invention and the advantages thereof, reference is now made to the following description, taken in conjunction with the accompanying drawings in which.

DETAILED DESCRIPTION OF THE DRAWINGS

The present invention uses a layer of a tensioning material on the bottom or second side of a silicon substrate to counteract the tensioning force and warping effect brought on by a gallium arsenide layer applied to the first or top side of the silicon substrate.

Figure 1:
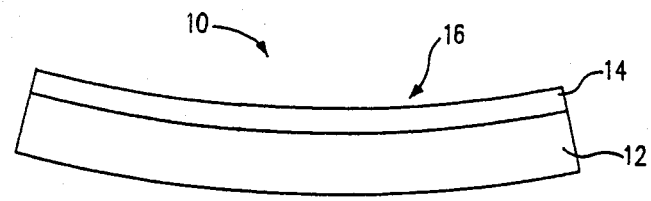
FIG. 1 shows a cross-sectional side view of a silicon substrate having formed thereon a layer of gallium arsenide and showing the warping effect of the layer of gallium arsenide on the silicon substrate.

FIG. 1 shows a cross-sectional side view of a structure 10 comprised of a silicon substrate 12 on the surface of which has been formed a layer of gallium arsenide 14. As is evident in FIG. 1, structure 10 is warped so that the surface 16 of the gallium arsenide layer 14 forms a concave surface in a direction away from the silicon substrate 12.

The concave surface 16 of the structure 10 in FIG. 1 illustrates a problem which typically arised with the formation by conventional methods of gallium arsenide layers on silicon substrates. The gallium arsenide is typically formed in an approximately stress-free state on the surface of the silicon substrate at a temperature of approximately 650° C. Gallium arsenide has a thermal expansion coefficient approximately twice that of silicon. Accordingly, when the structure having a gallium arsenide layer formed thereon, is cooled to room temperature, the gallium arsenide layer contracts more rapidly and to a greater degree than does the silicon substrate. The stress thus induced in and by the gallium arsenide layer in a tensioning direction, serves to warp the structure 10 to form a concave surface 16. Such a concave surface is disadvantageous for many operations in the manufacture of semiconductor devices, particularly photolithography, and is also undesirable for other reasons.

Figure 2:
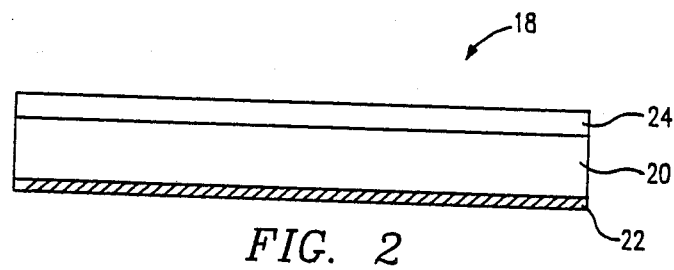
FIG. 2 shows a cross-sectional side view of a structure showing an embodiment of the present invention.

FIG. 2 shows a cross sectional side view of a structure 18 according to one embodiment of the present invention. The structure 18 comprises a silicon substrate 20 having formed on its top or first surface, a layer of gallium arsenide 24. The silicon substrate 20 also has formed on its bottom or second surface, a layer of tensioning material 22. The tensioning material may comprise any of a number of coefficient materials as outlined more fully below. The forces exerted by the layer of tensioning material 22 on the second surface of the silicon substrate 20, counteract the forces exerted on the first surface of the silicon substrate by the gallium arsenide layer 24, with the result that the structure 18 has a planar or substantially planar surface on the layer of gallium arsenide 24. The forces exerted on the substrate 20 by the layer of tensioning material 22, keep the structure 18 from warping in the fashion of the structure 10 of FIG. 1. The structure 18 of FIG. 2 can be formed by a number of methods.

Figure 3:
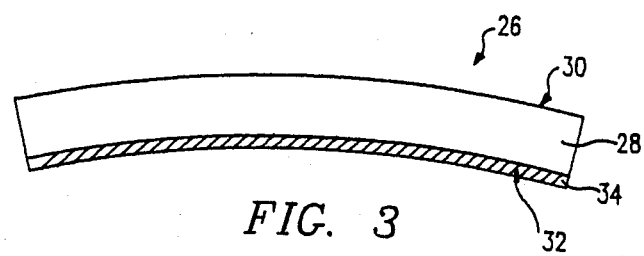
FIG. 3 shows a cross-sectional side view of a structure illustrating steps in the process of the embodiment of the present invention.

Shown in FIG. 3, is one method according to an embodiment of the present invention, of forming a structure such as that shown in FIG. 2. FIG. 3 shows a cross sectional side view of a structure 26 comprising a silicon substrate 28, having a first surface 30, a second surface 32 and, formed on said second surface 12, a layer of tensioning material 34. Prior to formation of the layer of tensioning material 34 on the second surface 32 of the silicon substrate 28, the first and second surfaces 30 and 32 respectively, of the silicon substrate 28, were substantially planar. After the layer of tensioning material 34 has been formed on the second surface 32 of the silicon substrate 28, and treated to cause it to exert the desired tensioning force on the second surface 32 of the silicon substrate 28, the silicon substrate 28 is warped as shown in FIG. 3 (with the first surface 30 forming a convex surface, and the second surface 32 being of a concave shape). Once the layer of tensioning material 34 has been formed on the second surface 32 of the substrate 28 and treated to warp the substrate as shown in FIG. 3, a layer of gallium arsenide, such as layer 24 of FIG. 2, can be formed on the first surface 30 of the silicon substrate 28. After the layer of gallium arsenide is formed and cooled, the structure 26 of FIG. 3 will have the planar form of the structure 18 of FIG. 2.

The tensioning material used to form layer 34 in FIG. 3, preferably comprises materials having a coefficient of thermal expansion larger than that of silicon. Since the tensioning materials have a larger coefficient of thermal expansion than silicon, when a layer of the material has been formed on the silicon, then heated, and then cooled, the tensioning material will contract more rapidly than the silicon and produce the warped or warping effect shown in FIG. 3.

Preferred materials for the tensioning materials include metal (or refractory) silicides, and more preferably, tungsten silicide and titanium silicide. Additional preferred metal silicides include tantalum silicide, molybdenum silicide, cobalt silicide and nickel silicide, as well as other materials. Several reasons support the preferability of metal silicides as tensioning materials. One reason is because the metal silicides have a relatively high coefficient of thermal expansion compared with that of silicon. They also have a larger coefficient of thermal expansion than does gallium arsenide. Because of these two factors, a relatively thin film of metal silicide can be used on the back side of the silicon substrate to counteract the warping or tensioning force of the gallium arsenide layer. For example, the coefficient of thermal expansion for silicon is 3.2 ($10^{-6}$/°C.), for gallium arsenide is 6.5 ($10^{-6}$/°C., and for tungsten silicide is 13.7 ($10^{-6}$/°C.).

Another reason for preferring metal silicides as tensioning materials is the compatability of metal silicides with silicon processing. Since the metal silicides are relatively stable on the silicon, they are not inclined to oxidize or react with silicon as might a non-silicided metal layer formed on the silicon. Accordingly, metals, although they may be used, are not as preferred in the present invention as metal silicides.

Another reason for preferring metal silicides as tensioning materials, arises from the preference of using relatively thinner films on silicon as compared to relatively thicker films. Thicker films have a greater tendency to spall off or separate from the silicon substrate than do thinner films. Because the metal silicides provide the desired tensioning force in a relatively thin film, they are, consequently, preferred materials for this use.

Another reason for preferring metal silicides is that they are frequently used in semiconductor manufacture, and consequently, there is a good deal of knowledge and experience in using and forming layers of metal silicide materials on silicon. Additionally, existing equipment can be used to apply the metal silicide layers.

Another important reason for preferring the use of metal silicides as the layer of tensioning material, arises from the fact that they reach a standard state when heated to and held at or above their annealing temperature. Accordingly, and advantageously, no matter what method of forming the layer of metal silicide on the back side of the substrate is used, by heating the substrate the layer of metal silicide to an annealing temperature, frequently in the range of 1000° C., the metal silicide will reach a standard state so that the resultant warpage when the structure is cooled, is consistent or reproducible. For example, the metal silicide layer may be applied to the back side of the silicon substrate by a number of methods including sputtering, chemical vapor deposition, evaporation, or other methods. Typically, the method of formation of the metal silicide layer will give rise to various intrinsic stresses in the metal silicide layer, the amount of intrinsic stress depending on the method of formation of the metal silicide layer. However, when the metal silicide is heated to an annealing temperature, the intrinsic stress of the metal silicide layer is relieved or destroyed and the metal silicide layer reaches a stress-free standard state which is independent of the method of formation of the layer. Accordingly, when the metal silicide layer is cooled, the principal, and possibly only, stress in the layer is a thermal stress arising because of the difference between the rate of thermal expansion of the metal silicide layer and that of the silicon. It can also be said that when cooled from the annealing temperature, the metal silicide layer acts in a predictable and consistent manner regardless of the method of formation of the metal silicide layer.

Another advantage of use of the refractory silicides is that they are polycrystalline after annealing and so the stress developed by them after annealing is not directionally dependent.

After the layer of tensioning material has been formed on the back side of the silicon substrate and treated to produce the desired warping effect, the gallium arsenide layer may be formed by a variety of techniques, including molecular beam epitaxy, MOCVD, or other methods. These methods are typically accomplished at approximately 650° C. After the layer of tensioning material has been treated, i.e. annealed at approximately 1000° C., it is not necessary to bring the structure to room temperature, but rather, the structure can be cooled to 650° C., and the layer of gallium arsenide formed.

One embodiment of the present invention calls for use of a silicon substrate approximately 25 mils thick having first and second planar surfaces. A layer of titanium silicide of about 0.5 micron thickness is sputtered onto the second planar surface of the substrate. The substrate with the layer of titanium silicide formed thereon, is heated to a temperature of about 1000° C. and maintained at that temperature for sufficient time for the titanium silicide to stabilize.

Next, the substrate is cooled to 650° C. and a layer of gallium arsenide about 3 microns thick is grown on the first surface of the silicon substrate. After formation of the layer of gallium arsenide is complete, the structure is cooled to room temperature. Upon cooling, the structure has a planar or essentially planar surface on the gallium arsenide layer.

It should be noted that, although the present invention has been described with regard to embodiments wherein the layer formed on the first surface of the silicon substrate comprises gallium arsenide, it is within the scope of the present invention that the layer formed on the first surface of the silicon substrate may comprise materials other than gallium arsenide. The present invention is of preferred application in those instances where the material of the layer formed has a coefficient of thermal expansion greater than that of silicon, or for other reasons, induces a tensioning force at the interface of the material in the silicon substrate.

Rethajazyk and Sinha in *Thin Solid Films* 70 (1980) at page 241, describe that the intrinsic film stress of the refractory silicide is relieved by an anneal process of approximately 1000° C. Moreover, it is suggested that after the annealing process, the room temperature stress of the refractory silicide layer is due entirely to differential thermal expansion during cooling to room temperature. The thermal stress ($\sigma_T$) is given by the formula of:

$$\sigma_T = (\alpha_f - \alpha_s)\Delta T E$$

where $\alpha_s$ and $\alpha_f$ are the coefficients of thermal expansion for the substrate and the film respectively, and where $\Delta T$ is the difference between the anneal and the room temperature, and where E is the Young's modulus of the film.

Using as an example, a backside film of tungsten silicide, and assuming that the tungsten silicide is annealed at 10000° C., and that the gallium arsenide layer is deposited at 650° C., the stress in the gallium arsenide and the tungsten silicide layers will be as follows:

$$\sigma_T (\text{WSi}_2 \text{ on Si}) = (13.7 - 3.2)(1000°\text{C.} - 25°\text{C.})[E \times 10^{-6}]$$
$$= 10237 [E \times 10^{-6}]$$
$$\sigma_T (\text{GaAs on Si}) = (6.5 - 3.2)(650°\text{C.} - 25°\text{C.})[E \times 10^{-6}]$$
$$= 2062 [E \times 10^{-6}]$$

In this example, the forces applied to the silicon faces will be:

Force = $\sigma_T \times$ (film thickness)

assuming that E for tungsten silicide is about, or equal to, E for gallium arsenide, a tungsten silicide film of about 1/5 thickness of the gallium arsenide film will be required to produce a flat or planar slice.

Features of the present invention are shown in the following experiment in which the warping effect of a tungsten silicide layer on a silicon substrate was studied.

Experiment No. 1

A 0.5 micron thick layer of tungsten silicide was formed on a surface of a silicon substrate having a diameter of two inches. The layer of tungsten silicide was annealed at 1000° C. After cooling to room temperature, a deflection of $14.7 \times 10^{-6}$ meters was observed for the surface of the substrate.

Figure 4:
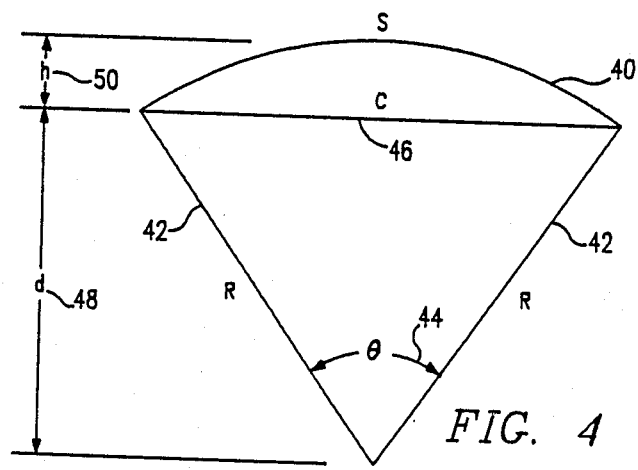
FIG. 4 shows a cross-sectional side view of a warped substrate and illustrates dimensions which can be used to calculate the radius of curvature of the substrate surface.

Referring to FIG. 4 there is shown a cross-sectional side view of an illustrative warped substrate. Also shown are dimensions which can be used to calculate the radius of curvature of the warpes substrate surface and to check the deflection or warping induced by the tungsten silicide layer of Experiment No. 1 against a theoretical warping of the silicon substrate.

Shown in FIG. 4 is an arc 40 (or "S") representing a warped surface of the substrate seen in a cross-sectional side view. Lines 42 (or "R") represent radii to the ends of arc 40, and form an angle 44 (or "$\theta$") with each other. Line 46 (or "C") is a cord extending between the ends of arc 40. Line 48 (also "d") represents the perpendicular distance from cord 46 to the intersection of radii 42. Line 50 (also "h") represents the perpendicular distance from cord 46 to the midpoint of arc 40.

The value of the radius of curvature of the wafer of Experiment No. 1, as figuratively depicted in FIG. 4, can be calculated as follows:

$$d = R \cos \frac{\theta}{2}$$

$$(R - h) = R \cos \frac{\theta}{2}$$

$$R\left(1 - \cos \frac{\theta}{2}\right) = h$$

Using the Maclaurin Series:

$$\cos x = 1 - \frac{x^2}{2!} + \frac{x^4}{4!} - \frac{x^6}{6!} + \ldots$$

For small values of $\theta$, the series can accurately be truncated to its first two elements so that:

$$\cos \theta/2 \approx 1 - \frac{\theta/2^2}{2!}.$$

Accordingly:

$$R\left(1 - 1 + \frac{\theta^2}{8}\right) = h$$

$$\frac{1}{8} R \theta^2 = h$$

Since $S = R\theta$ and $\theta = S/R$, $$\frac{1}{8} R \frac{S^2}{R^2} = h$$

$$R = \frac{1}{8} \frac{S^2}{h}.$$

For the measured deflection of $14.7 \times 10^{-6}$ meters, $$R = \left[\frac{1}{8}\right] \frac{(5.08 \times 10 \text{ m}^{-2})^2}{14.7 \times 10^{-6} \text{ m}} = 22 \text{ meters}$$

The film stress is given by Sinha (*Thin Solid Films* 70 (1980) p. 241) as:

$$\sigma = \frac{1}{6} \frac{D^2}{t \Delta R} \left(\frac{E}{1 - \nu}\right)_{substrate}$$

where:
$\sigma$ = film stress
D = substrate thickness
t = film thickness
$\Delta R$ = radius of curvature For the wafer of Experiment No. 1, the film stress can be calculated $$\left(\text{since} \left(\frac{E}{1 - \nu}\right)_{substrate} = 1.8 \times 10^{12} \frac{\text{Dynes}}{\text{cm}^2}\right)$$

$$\sigma = \frac{1}{6} (1.8 \times 10^{12} \text{ Dynes/cm}^2) \frac{(6.35 \times 10^{-4} \text{ m})^2}{(0.5 \times 10^{-6} \text{ m}) (22 \text{ m})}$$

$$\sigma = 1.1 \times 10^{10} \text{ Dynes/cm}^2$$

The film stress calculated from the deflection measured in Experiment No. 1 ($\sigma = 1.1 \times 10^{10}$ Dynes/cm$^2$) compares favorably with the film stress calculated from the thermal expansion of the tungsten silicide layer. From formula 2:

$$\sigma T(\text{WSi}_2 \text{ on Si}) = 10237[E \times 10^{-6}].$$

Since $\frac{E}{1 - \nu} = 1.8 \times 10^{12}$ Dynes/cm$^2$ and $\nu \approx 0.3$ $E = 1.26 \times 10^{12}$ Dynes/cm$^2$.

Accordingly, $\sigma T(\text{WSi}_2 \text{ on Si}) = 10237[(1.26 \times 10^{12} \text{ Dynes/cm}^{12} \text{ Dynes/cm}^2)(10^{-6})]$ $\sigma T(\text{WSi}_2 \text{ on Si}) = 1.29 \times 10^{10}$ Dynes/cm$^2$.

The film stress calculated from the thermal expansion is $1.29 \times 10^{10}$ Dyne/cm$^2$, in good agreement with Experiment 1.

It should be noted that in the practice of the present invention it is not necessary that the substrate on which the gallium arsenide or other semiconducting material is formed, comprise silicone. The substrate may comprise other materials as desired. Additionally, the present invention can be applied where the semiconducting layer formed on the substrate comprises materials other than gallium arsenide.

It should also be noted that the annealing or heat treatment of the backside film (for example, a metal silicide) can be accomplished during the step of forming the backside film on the substrate. This would occur when the backside film is formed in a process at elevated temperatures approaching the annealing temperature of the material of the backside film. Consequently, the backside film, formed at approximately its annealing temperature, when formed, can be at approximately its standard state reached at annealing temperatures, and when cooled, will exhibit the tensioning effect desired for that layer.

It is also possible that the treatment or annealing step of the present invention can be conducted during the pretreatment step for the deposition of the gallium arsenide layer on the silicon substrate. Typically, prior to deposition of the gallium arsenide layer on the silicon substrate, the silicon substrate is heated to temperatures of approximately 1000° to clean the surface of the silicon substrate prior to deposition of the gallium arsenide material. This heating step can comprise the treatment or annealing step for the backside film. After the approximately 1000° heating step, the silicon substrate is cooled to a temperature, typically at approximately 650° C. at which the gallium arsenide layer is deposited on the substrate. When the entire structure is eventually cooled to room temperature, both the gallium arsenide layer and the backside film exert tensioning forced on their respective surfaces of the silicon substrate, resulting in an approximately planar surface for the gallium arsenide layer.

It should also be understood that after formation of the gallium arsenide layer on the silicon substrate, fabrication processes as known in the art can be conducted on the structure to form semiconductor devices on or in the gallium arsenide layer.

While a preferred embodiment of the present invention and its advantages has been set out in the above detailed description, the invention is not limited thereto, but only by the spirit and scope of the appended claims.

What is claimed is:

1. A method for reducing warpage of an epitaxial layer of a first semiconductor material formed on a second semiconductor material wherein the warpage predominantly results from said first and second materials having different coefficients of thermal expansion, said second semiconductor material having first and second opposing surfaces, said method comprising the steps of:

forming a layer of tensioning material on the second surface of said second material;

treating said tensioning material to exert a force which warps said second material; and forming a substantially epitaxial layer of said first material on the first surface, said first material exerting a force counteracting the force of said tensioning material.

2. The method of claim 1 wherein said first material has a coefficient of thermal expansion which is greater than the coefficient of thermal expansion of said second material.

3. The method of claim 2, wherein said tensioning material has a coefficient of thermal expansion which is greater than the coefficient of thermal expansion of said second material.

4. The method of claim 2, wherein said second material comprises silicon.

5. The method of claim 1, wherein said first material comprises gallium arsenide.

6. The method of claim 1, wherein said tensioning material comprises a metal silicide.

7. The method of claim 1, wherein said tensioning material has a coefficient of thermal expansion greater than the coefficient of thermal expansion of said substrate.

8. The method of claim 6 wherein said metal silicide comprises tungsten silicide.

9. The method of claim 1, wherein said step of treating said tensioning material comprises heating and cooling said tensioning material.

10. The method of claim 4, wherein said first material comprises gallium arsenide.

11. The method of claim 10, wherein said tensioning material comprises a metal silicide.

12. The method of claim 11, wherein said metal silicide comprises tungsten silicide.

13. The method of claim 11, wherein said metal silicide comprises titanium silicide.

14. The method of claim 1 wherein the force exerted by said first material returns said second material to a substantially planar shape.

15. The method of claim 14 wherein at least a portion of the force exerted by said tensioning material is developed before said epitaxial layer is formed.

16. The method of claim 1 wherein said tensioning material has a coefficient of thermal expansion which is greater than the coefficient of thermal expansion of said second material so that said tensioning material can be formed to a 0.5 micron thickness or less in order to prevent said tensioning material from spalling off from said second surface.

17. The method of claim 1 wherein said tensioning material has a coefficient of thermal expansion which is substantially greater than the coefficient of thermal expansion of said second material.

18. The method of claim 1 wherein said tensioning material has a coefficient of thermal expansion which is greater than the coefficient of thermal expansion of said first material.

19. The method of claim 17 wherein said tensioning material has a coefficient of thermal expansion which is greater than the coefficient of thermal expansion of said first material.

20. The method of claim 1 wherein the step of treating said tensioning material comprises the steps of:

heating said tensioning material to relieve intrinsic stress; and cooling said tensioning material so that the force applied to said second material by said tensioning material is primarily thermal stress due to the differing thermal properties between said second material and said tensioning material.

21. The method of claim 1, further comprising the step of:

forming semiconductor devices in a region on a surface of said first material.

22. A method for forming a substantially planar epitaxial layer of a first semiconductor material on a second semiconductor material, said second material having first and second opposing surfaces, the method reducing warpage effects caused by said first material having a different coefficient of thermal expansion than said second material, the method comprising the steps of:

forming a layer of tensioning material on the second surface, said tensioning material having a different coefficient of thermal expansion than said first material;

forming a layer of said first semiconducting material on the first surface; and exerting counteracting stresses on the first and second surfaces by cooling said first material and said tensioning material so that the resulting shape of said second material is substantially planar.

23. The method of claim 22, wherein said second material is essentially monocrystalline.

24. The method of claim 23, wherein said first material comprises gallium arsenide.

25. The method of claim 24, wherein said tensioning material comprises a metal.

26. The method of claim 25, wherein said tensioning material comprises metal silicide.

27. The method of claim 23, wherein said metal silicide comprises at least one of titanium silicide, tungsten silicide, tantalum silicide, molybdenum silicide, cobalt silicide and nickel silicide.

28. The method of claim 26 further comprising the step of annealing the silicide before exerting the counteracting stresses.

29. The method of claim 23 wherein the anneal is performed prior to forming the layer of first material on the first surface.

30. The method of claim 22 wherein said first material is formed in a substantially monocrystalline layer.

31. The method of claim 24, further comprising the step of:

forming semiconductor devices in a region on a surface of said first material.

32. An improved method of forming a gallium arsenide layer on a first surface of a silicon substrate, said silicon substrate having a second surface opposite said first surface, said method comprising:

forming a layer of a first metal silicide on said second surface of said silicon substrate;

forming a layer of gallium arsenide on said first surface of said silicon substrate;

heating said layer of said metal silicide to approximately its annealing temperature; and cooling said layer of said metal silicide from approximately its annealing temperature so that said layer of said metal silicide exerts a tensioning force across said second surface of said silicon substrate which counters warping effects of a tensioning force exerted on said first surface on said silicon substrate by said layer of gallium arsenide so that said first surface of said silicon substrate has a substantially planar orientation.

33. The method of claim 32, further comprising the step of forming semiconducting devices on a surface of said layer of gallium arsenide.

* * * * *

UNITED STATES PATENT AND TRADEMARK OFFICE
CERTIFICATE OF CORRECTION

PATENT NO. : 4,830,984
DATED : May 16, 1989
INVENTOR(S) : Purdes

It is certified that error appears in the above-identified patent and that said Letters Patent is hereby corrected as shown below:

Column 1, insert before "TECHNICAL FIELD", --This invention was made with Government support under Contract N00014-87-K-0847 awarded by the Department of the Navy. The Government has certain rights in this invention.--

Signed and Sealed this

Third Day of August, 1993

Attest:

MICHAEL K. KIRK

Attesting Officer

Acting Commissioner of Patents and Trademarks